(12) United States Patent
Kim

(10) Patent No.: US 8,111,501 B2
(45) Date of Patent: Feb. 7, 2012

(54) CAPACITOR

(75) Inventor: Gil-Sub Kim, Daegu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 293 days.

(21) Appl. No.: 12/385,938

(22) Filed: Apr. 24, 2009

(65) Prior Publication Data

US 2009/0268370 A1 Oct. 29, 2009

(30) Foreign Application Priority Data

Apr. 28, 2008 (KR) .................. 10-2008-0039421

(51) Int. Cl.
*H01G 4/005* (2006.01)
(52) U.S. Cl. ..... 361/303; 361/305; 361/309; 361/301.2; 361/301.4; 361/301.1
(58) Field of Classification Search .................. 361/303, 361/306.2, 306.3, 311–312, 301.3, 301.2, 361/305, 301.4, 301; 438/385–386; 257/294, 257/295

See application file for complete search history.

(56) References Cited

U.S. PATENT DOCUMENTS

| | | | | |
|---|---|---|---|---|
| 6,097,053 A * | 8/2000 | Ando | ............................. | 257/308 |
| 6,124,126 A * | 9/2000 | Ito et al. | ........................ | 435/200 |
| 6,248,625 B1 * | 6/2001 | Hirota et al. | ................... | 438/253 |
| 6,552,379 B2 * | 4/2003 | Nagai | ............................. | 257/296 |
| 6,894,886 B2 * | 5/2005 | Eriksson et al. | ............ | 361/301.5 |
| 7,018,933 B2 * | 3/2006 | Kim et al. | ...................... | 438/710 |
| 7,094,660 B2 * | 8/2006 | Park | ............................. | 438/386 |
| 7,312,130 B2 | 12/2007 | Kim et al. | | |
| 7,871,891 B2 * | 1/2011 | Cho et al. | ...................... | 438/386 |
| 2007/0170487 A1 | 7/2007 | Heitmann et al. | | |

FOREIGN PATENT DOCUMENTS

KR  10-2004-0059984 A  7/2004
KR  10-2005-0049135 A  5/2005

* cited by examiner

*Primary Examiner* — Nguyen T Ha

(74) *Attorney, Agent, or Firm* — Lee & Morse, P.C.

(57) ABSTRACT

A method of forming a capacitor includes forming a cylindrical lower electrode structure having an internal support structure on a substrate, forming a dielectric layer on the cylindrical lower electrode structure and the support structure, and forming an upper electrode on the dielectric layer.

5 Claims, 20 Drawing Sheets

CAPACITOR

BACKGROUND

1. Field

Example embodiments relate to a capacitor, a method of forming the same, and a method of manufacturing a semiconductor device including the same. More particularly, example embodiments relate to a capacitor having high capacitance, a method of forming the same, and a method of manufacturing a semiconductor device including the same.

2. Description of the Related Art

As semiconductor devices have been highly integrated, a unit cell thereof may have a reduced area. Because driving capacity of a dynamic random access memory (DRAM) depends on capacitance of a capacitor, research on increasing capacitance of a capacitor with a reduced area have been performed.

Generally, capacitance of the capacitor is proportional to an effective area thereof and to a dielectric constant of a dielectric layer, and inversely proportional to a thickness of the dielectric layer. Thus, a cylindrical capacitor may be used in order to increase the effective area of the capacitor. Additionally, the dielectric layer of the capacitor may be formed to have a thin thickness and of a high-k material.

However, since a conventional cylindrical capacitor may have a high aspect ratio, adjacent cylindrical capacitors may lean on each other when a mold layer for forming the capacitors is removed, and thus, 2-bit fail may occur. Additionally, a lower electrode of the conventional cylindrical capacitor may not be formed by a single process because of the large height thereof. Furthermore, the dielectric layer of the conventional cylindrical capacitor may not be formed on a lower portion of the lower electrode because of the high aspect ratio.

FIG. 1 illustrates a schematic perspective view of conventional cylindrical capacitors on a vertical metal-oxide-semiconductor (MOS) transistor. For example, as illustrated in FIG. 1, the conventional cylindrical capacitors may not be formed by a single process because of the large height thereof, and adjacent capacitors may lean on each other so that 2-bit fail may occur, e.g., upper portions of adjacent cylindrical capacitors may contact each other as illustrated in FIG. 1 Additionally, the cylindrical capacitor may have a high aspect ratio, and thus, forming a dielectric layer with a uniform thickness throughout the, e.g., entire, lower electrode may be difficult due to a high thickness of the dielectric layer at an entrance of the lower electrode.

SUMMARY

Embodiments are therefore directed to a capacitor, a method of forming the same, and a method of manufacturing a semiconductor device including the same, which substantially overcome one or more of the problems due to the limitations and disadvantages of the related art.

It is therefore a feature of an embodiment to provide a capacitor with a support structure therein, thereby having high capacitance and capable of preventing leaning of adjacent capacitors on each other.

It is therefore another feature of an embodiment to provide a method of forming a capacitor with a support structure therein, thereby having high capacitance and capable of preventing leaning of adjacent capacitors on each other.

It is still another feature of an embodiment to provide a method of manufacturing a semiconductor device including capacitors with support structures therein, thereby having high capacitance and capable of preventing leaning of adjacent capacitors on each other.

At least one of the above and other features and advantages may be realized by providing a method of forming a capacitor, including forming a cylindrical lower electrode structure on a substrate, forming a support structure inside the cylindrical lower electrode structure, forming a dielectric layer on the cylindrical lower electrode structure and the support structure, and forming an upper electrode on the dielectric layer. In the method, a first mold layer having a first hole may be formed on a substrate. A first lower electrode may be formed on bottom and sidewall of the first hole. A filler layer may be formed on the substrate to fill up the remaining portion of the first hole. A second mold layer having a second hole may be formed on the filler layer, the second hole exposing the first mold layer and the first lower electrode. A second lower electrode may be formed on a sidewall of the second hole, the second lower electrode contacting the first lower electrode. The first and second mold layers may be removed. A dielectric layer may be formed on the first and second lower electrodes. An upper electrode may be formed on the dielectric layer.

In an example embodiment, before the second mold layer is formed, an etch stop layer may be further formed on the first mold layer, the first lower electrode and the filler layer. After the second mold layer is formed, the etch stop layer may be partially removed using the second mold layer as an etching mask to expose the first mold layer and the first lower electrode.

In an example embodiment, the dielectric layer may be formed on the first and second lower electrodes and the etch stop layer. Forming the filler layer may include completely filling the first hole in the first mold, such that upper surfaces of the filler layer, first electrode, and first mold are substantially coplanar.

In an example embodiment, when the second lower electrode is formed, a conductive layer may be formed on the second mold layer and bottom and sidewall of the second hole. A sacrificial layer may be formed on the conductive layer to fill up the remaining portion of the second hole. Upper portions of the sacrificial layer and the conductive layer may be removed. The sacrificial layer may be removed. A portion of the conductive layer on the first mold layer may be removed.

Forming the support structure inside the cylindrical lower electrode structure may include forming a filler layer inside a first lower electrode and an etch stop layer inside a second lower electrode, the second lower electrode being on the first lower electrode, and the etch stop layer being on the filler layer. Forming the cylindrical lower electrode structure may include sequentially forming first and second lower electrodes on the substrate, the first and second lower electrodes completely overlapping each other, and the support structure being inside the first and second lower electrodes. The support structure may be formed to a height of about 20% to about 50% of a height of the cylindrical lower electrode structure.

At least one of the above and other features and advantages may be realized by providing a method of manufacturing a semiconductor device, including forming a transistor on a substrate, the transistor including a gate structure and an impurity region, forming a contact electrically connected to the impurity region, forming a cylindrical lower electrode structure on the contact, forming a support structure inside the cylindrical lower electrode structure, forming a dielectric layer on the cylindrical lower electrode structure and on the support structure, and forming an upper electrode on the dielectric layer. In the method, a first mold layer having a first hole exposing the contact may be formed. A first lower electrode may be formed on bottom and sidewall of the first hole. A filler layer may be formed on the substrate to fill up the remaining portion of the first hole. A second mold layer having a second hole may be formed on the filler layer. The second hole may expose the first mold layer and the first lower electrode. A second lower electrode may be formed on a sidewall of the second hole. The second lower electrode may contact the first lower electrode. The first and second mold layers may be removed. A dielectric layer may be formed on the first and second lower electrodes. An upper electrode may be formed on the dielectric layer.

In an example embodiment, before the second mold layer is formed, an etch stop layer may be further formed on the first mold layer, the first lower electrode and the filler layer. After the second mold layer is formed, the etch stop layer may be partially removed using the second mold layer as an etching mask to expose the first mold layer and the first lower electrode.

At least one of the above and other features and advantages may also be realized by providing a capacitor, including a cylindrical lower electrode structure on a substrate, a support structure inside the cylindrical lower electrode structure, a dielectric layer on the cylindrical lower electrode structure and the support structure, and an upper electrode on the dielectric layer.

In an example embodiment, the cylindrical lower electrode may include a first lower electrode and a second lower electrode. The first lower electrode may be formed on the substrate, and the second lower electrode may be formed on the first lower electrode.

In an example embodiment, the support structure may include a filler layer and an etch stop layer. The filler layer may be formed on a sidewall of the first lower electrode, and the etch stop layer may be formed on a portion of a sidewall of the second electrode. The support structure may include a filler layer and an etch stop layer, the filler layer completely filling the first lower electrode, and the etch stop layer being on the filler layer and inside the second lower electrode. The dielectric layer may extend along the first lower electrode, second lower electrode, and etch stop layer In an example embodiment, the support structure may have a height of about 20 to about 50% of that of the cylindrical lower electrode structure.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
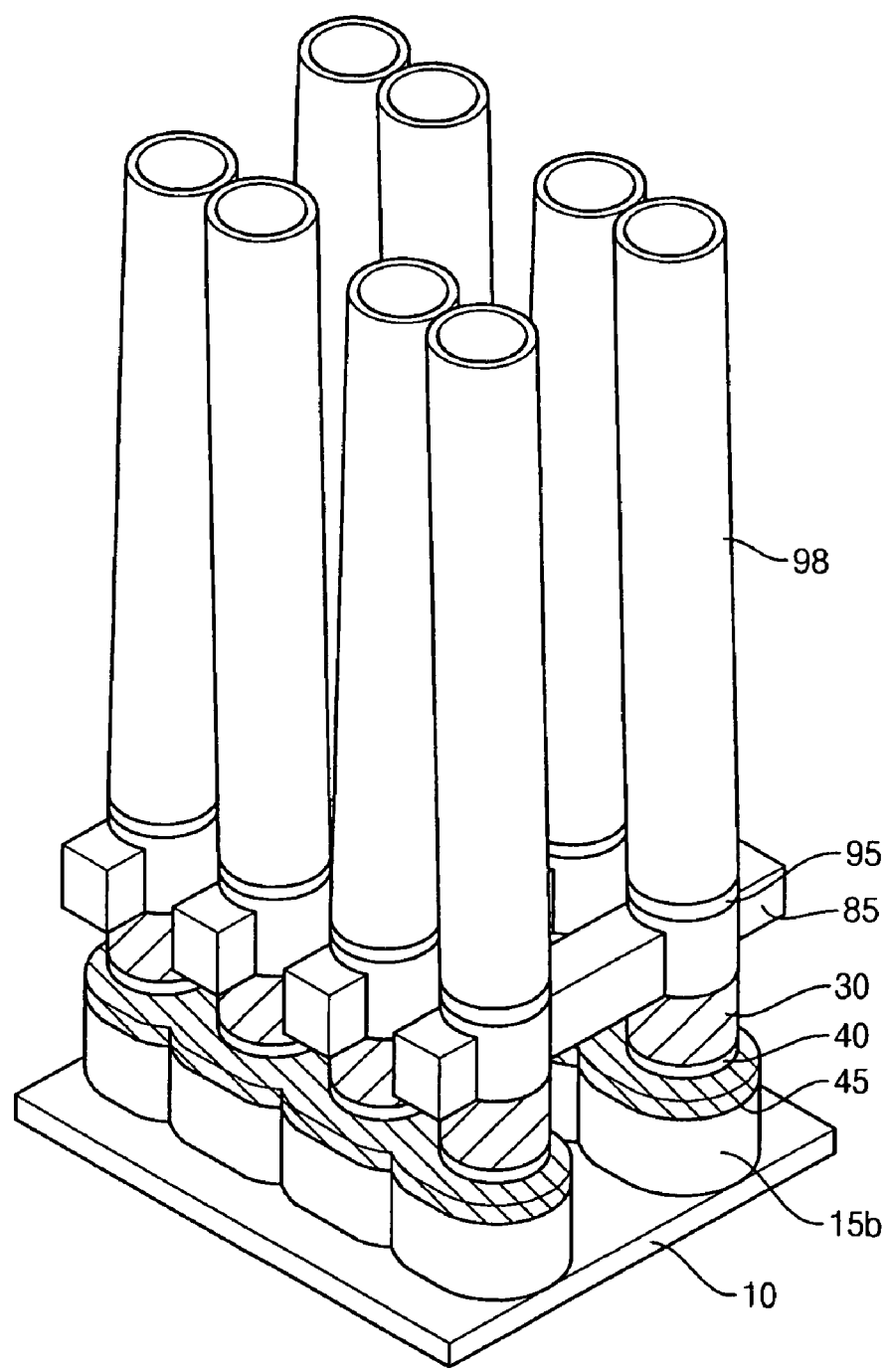
FIG. 1 illustrates a schematic perspective view of a conventional cylindrical capacitor.

Korean Patent Application No. 10-2008-0039421, filed on Apr. 28, 2008, in the Korean Intellectual Property Office, and entitled: "Capacitor, Method of Forming the Same and Method of Manufacturing a Semiconductor Device Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will be understood that when an element or layer is referred to as being "on," "between," "connected to," or "coupled to" another element or layer, it can be directly on, between, connected to or coupled to the other element or layer, or intervening elements or layers may be present. In contrast, when an element is referred to as being "directly on," "directly between," "directly connected to" or "directly coupled to" another element or layer, there are no intervening elements or layers present. Like reference numerals refer to like elements throughout. As used herein, the term "and/or" includes any and all combinations of one or more of the associated listed items.

It will also be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 2 to 25 illustrate cross-sectional stages in a method of manufacturing a semiconductor device including capacitors in accordance with some example embodiments.

Figure 2:
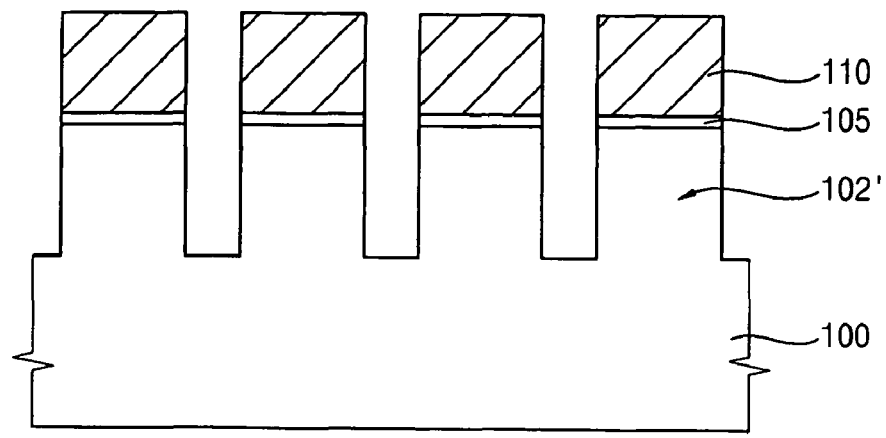
FIGS. 2 to 25 illustrate cross-sectional view of stages in a method of manufacturing a semiconductor device including capacitors in accordance with some example embodiments.

Referring to FIG. 2, a pad oxide layer 105 may be formed on a semiconductor substrate 100. The pad oxide layer 105 may be formed, e.g., by a thermal oxidation process. The pad oxide layer 105 may be formed to have a thickness, i.e., a distance as measured along a vertical direction perpendicular to the semiconductor substrate 100, of about 50 angstroms to about 150 angstroms. A hard mask 110 may be formed on the pad oxide layer 105. The hard mask 110 may be formed using a material different from the semiconductor substrate 100 and the pad oxide layer 105. For example, the hard mask 110 may be formed using silicon nitride.

The pad oxide layer 105 and the semiconductor substrate 100 may be partially etched using the hard mask 110 as an etching mask. For example, the semiconductor substrate 100 may be etched to a depth of about 800 angstroms to about 1500 angstroms. Thus, a plurality of pillars 102' may be formed in the semiconductor substrate 100, so each pillar 102' may have a first width, i.e., a horizontal distance as measured along a direction parallel to a bottom of the semiconductor substrate 110 in FIG. 2. The first width may be a substantially same width as a corresponding portion of the hard mask 110 and as a corresponding portion of the etched pad oxide 105.

Figure 3:
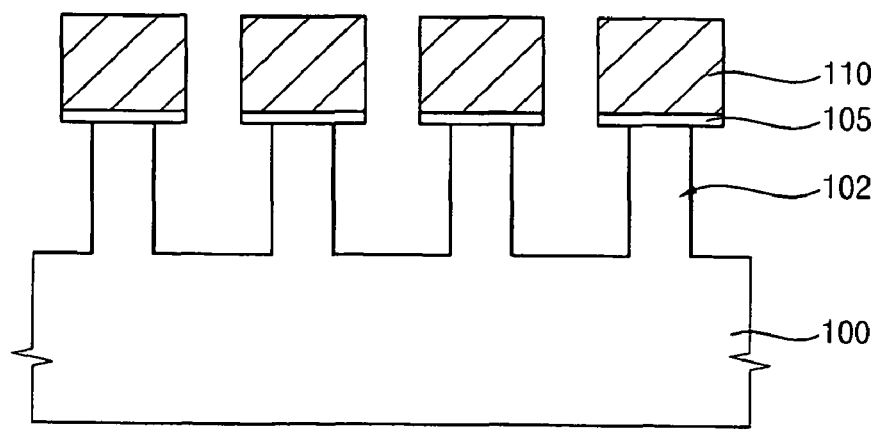

Referring to FIG. 3, the pillars 102' may be partially etched to reduce the first width of the pillar 102' by a predetermined width, so a width of partially etched pillars 102 may be smaller than the width of the hard mask 110. For example, a width of a portion removed, i.e., etched, from each side of a pillar 102 may substantially equal a total thickness, i.e., as measured along the horizontal direction, of a gate insulation layer 115 and a gate electrode 122 (refer to FIG. 5). For example, the width of a portion removed from each side of the pillar 102' may be about 200 angstroms to about 300 angstroms. The pillars 102' may be partially etched, e.g., by a wet etching process or a chemical dry etching process.

Figure 4:
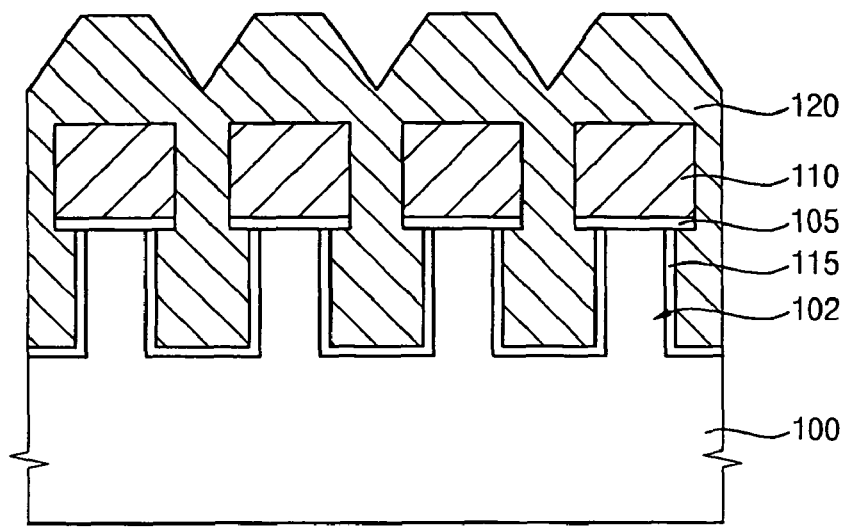

Referring to FIG. 4, the gate insulation layer 115 may be formed on the exposed semiconductor substrate 100, e.g., on a surface of the semiconductor substrate 100 between the pillars 102, and on sidewalls of the pillars 102. For example, the gate insulation layer 115 may be formed using one or more of silicon oxide, hafnium oxide, tantalum oxide, etc. In another example, the gate insulation layer 115 may be formed using a multi-stacked layer, e.g., an oxide-nitride-oxide (ONO) layer. A conductive layer 120 may be formed on the semiconductor substrate 100 to cover the gate insulation layer 115, the pad oxide layer 105 and the hard mask 110. For example, as illustrated in FIG. 4, the conductive layer 120 may fill, e.g., completely fill, a space between adjacent pillars 102. The conductive layer 120 may be formed using, e.g., doped polysilicon, doped silicon-germanium, etc.

Figure 5:
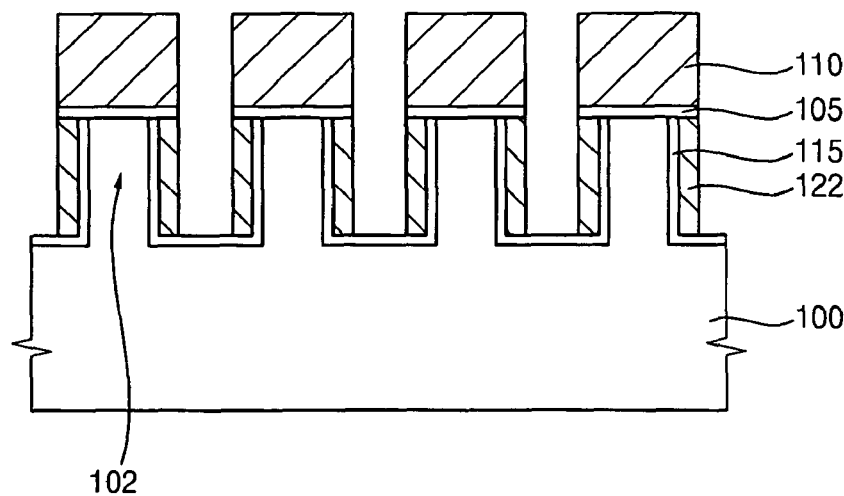

Referring to FIG. 5, the conductive layer 120 may be partially removed using the gate insulation layer 115 as an etch stop layer to form the gate electrode layer 122. For example, as illustrated in FIG. 5, portions of the conductive layer 120 may be removed so an outer surface of the gate electrode layer 122, i.e., a surface facing away from the gate insulation layer 115, may be substantially coplanar with a surface of the mask 110. A plurality of the gate electrode layers 122 may enclose the pillars 102. The gate electrode 122 and the gate insulation layer 115 may form a gate structure.

Figure 6:
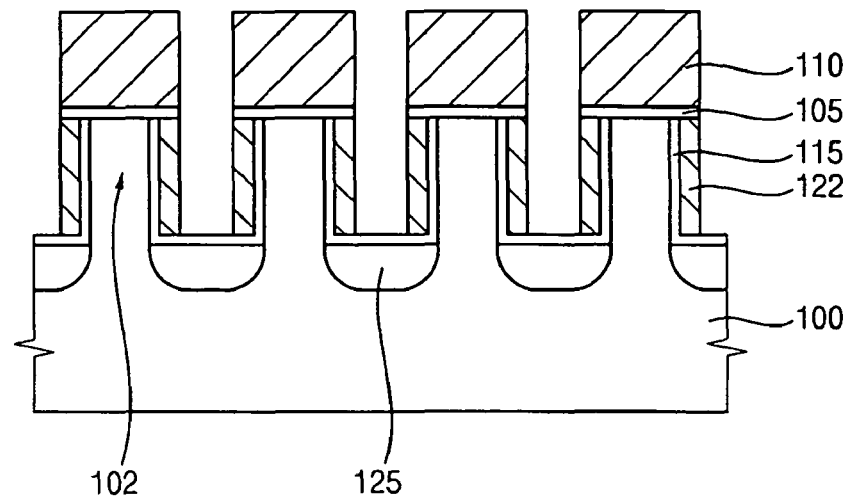

Referring to FIG. 6, impurities may be implanted onto a portion of the semiconductor substrate 100 between the pillars 102 to form a first impurity region 125. The conductive type of the impurities may be decided by the characteristics of the semiconductor substrate 100.

Figure 7:
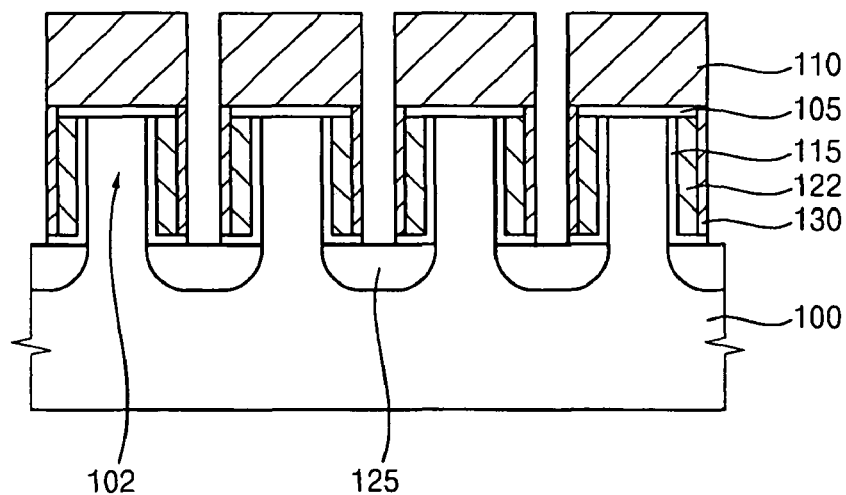

Referring to FIG. 7, an insulation layer (not shown) may be formed on the semiconductor substrate 100 to cover the gate electrode layer 122 and the hard mask 110. The insulation layer may be formed using, e.g., a nitride. The insulation layer may be partially removed, e.g., by a CMP process and/or an etch back process, to form a first spacer 130 on the gate electrode 122. A portion of the gate insulation layer 115 between adjacent gate structures may be removed using the hard mask 110 and the first spacer 130 as an etching mask, as illustrated in FIG. 7, so adjacent gate structures may be isolated from each other.

Figure 8:
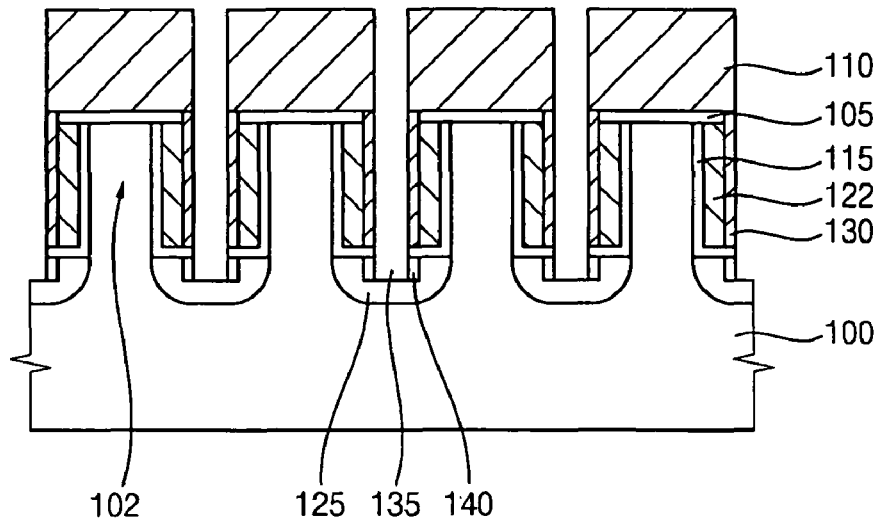

Referring to FIG. 8, the semiconductor substrate 100 may be partially removed using the first spacer 130 and the hard mask 110 as an etching mask to form a recess 135, e.g., in the first impurity region 125. The recess 135 may be formed to have a depth smaller than that of the first impurity region 125. A bitline insulation layer 140 may be formed on a sidewall of the recess 135. The bitline insulation layer 140 may insulate a bitline 145 (refer to FIG. 9) and the gate electrode 122.

Figure 9:
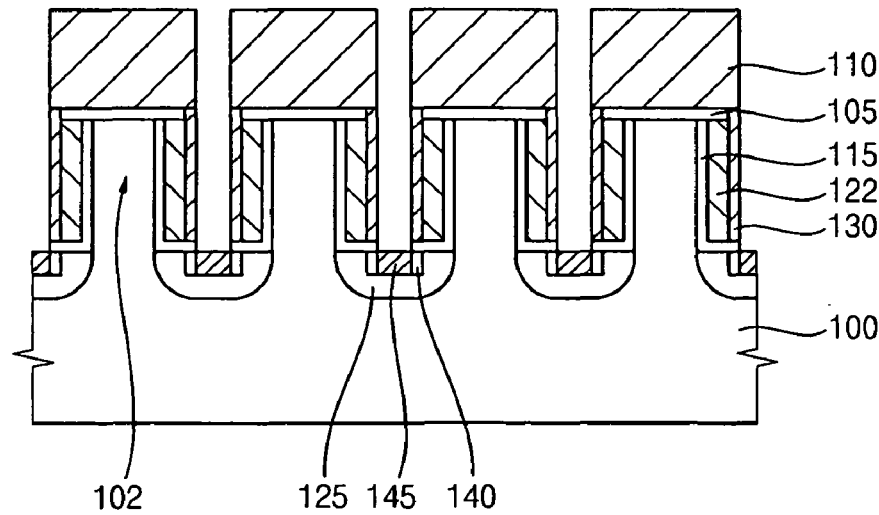

Referring to FIG. 9, the bitline 145 may be formed to fill up the remaining portion of the recess 135. The bitline 145 may be formed using a metal, e.g., one or more of cobalt, titanium, nickel, etc. The bitline 145 may be formed to have a thickness of about 100 angstroms to about 300 angstroms.

Figure 10:
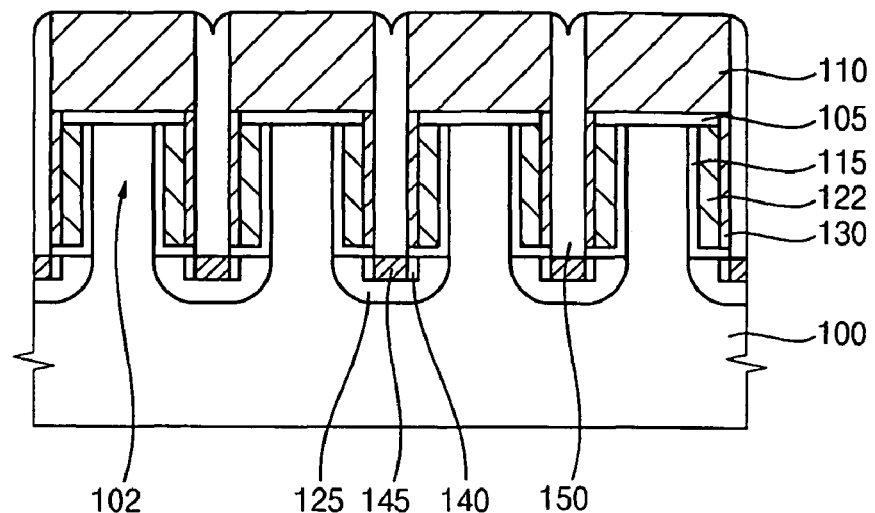

Referring to FIG. 10, a first insulating interlayer 150 may be formed to cover the bitline 145, the first spacer 130, and the hard mask 110. The first insulating interlayer 150 may be formed using, e.g., an oxide or a nitride. The first insulating interlayer 150 may fill up spaces between structures, e.g., between adjacent structures, having the hard mask 110, the pad oxide layer 105, the first spacer 130, the gate electrode 122, the gate insulation layer 115, and the pillar 102.

Figure 11:
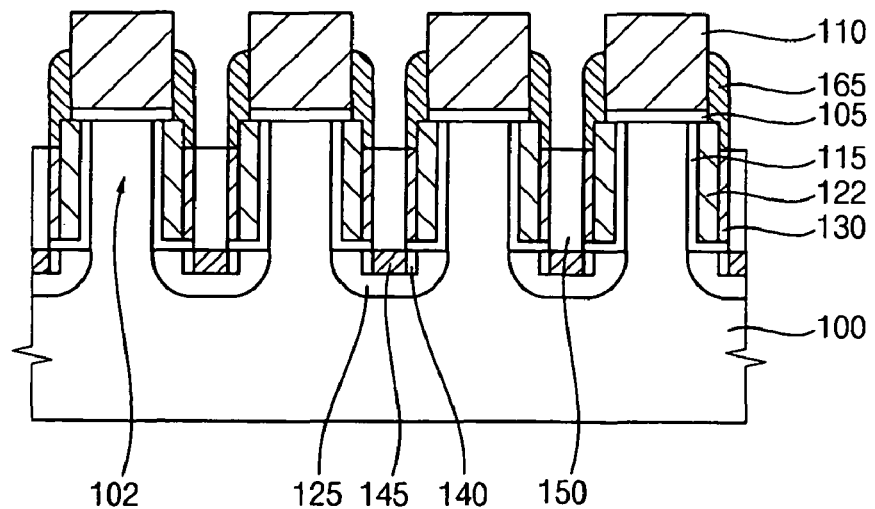

Referring to FIG. 11, the first insulating interlayer 150 may be partially removed to expose the hard mask 110. Additionally, the hard mask 110, the pad oxide layer 105 and the first spacer 130 may be partially removed to partially expose the gate electrode 122, e.g., portions of a sidewall and an upper surface of the gate electrode 122 may be exposed. A conductive spacer 165 may be formed to be electrically connected to the gate electrode 122. For example, the conductive spacer 165 may be formed on the exposed portion of the gate electrode 122, and may overlap a portion of the hard mask 110. The conductive spacer 165 may be formed using a metal, e.g., one or more of cobalt, titanium, nickel, etc. The conductive spacer 165 may be formed to have a thickness of about 100 angstroms to about 300 angstroms.

Figure 12:
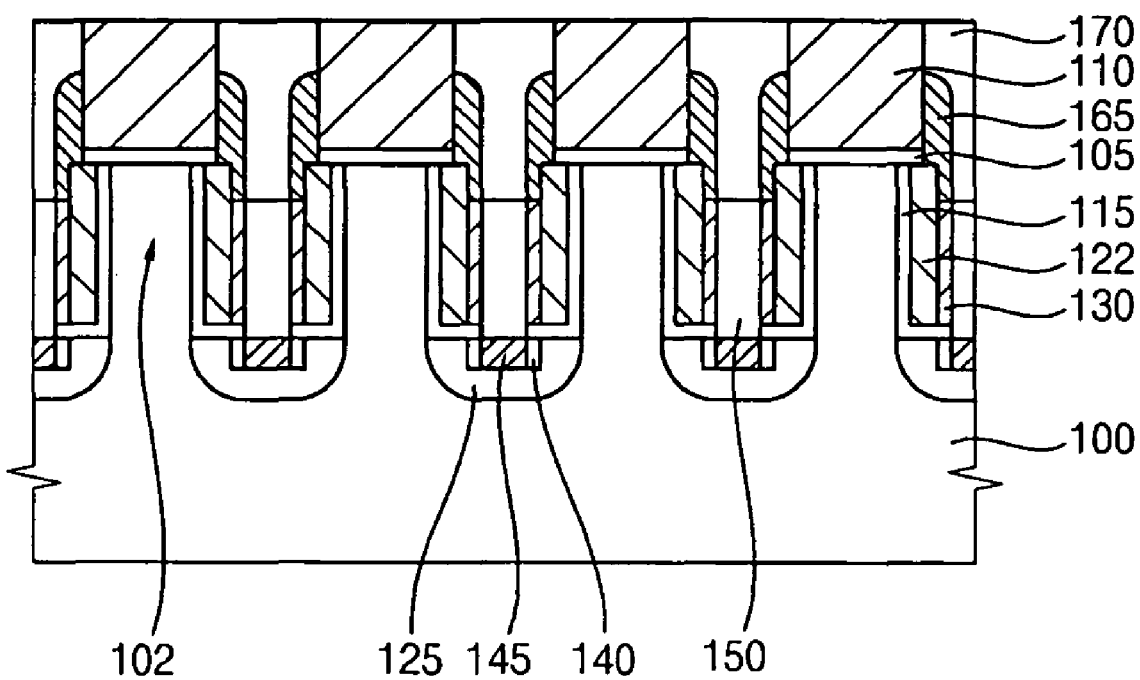

Referring to FIG. 12, an insulation layer (not shown) may be formed to cover the first insulating interlayer 150, the conductive spacer 165, and the hard mask 110. The insulation layer may be planarized to form a second insulating interlayer 170.

Figure 13:
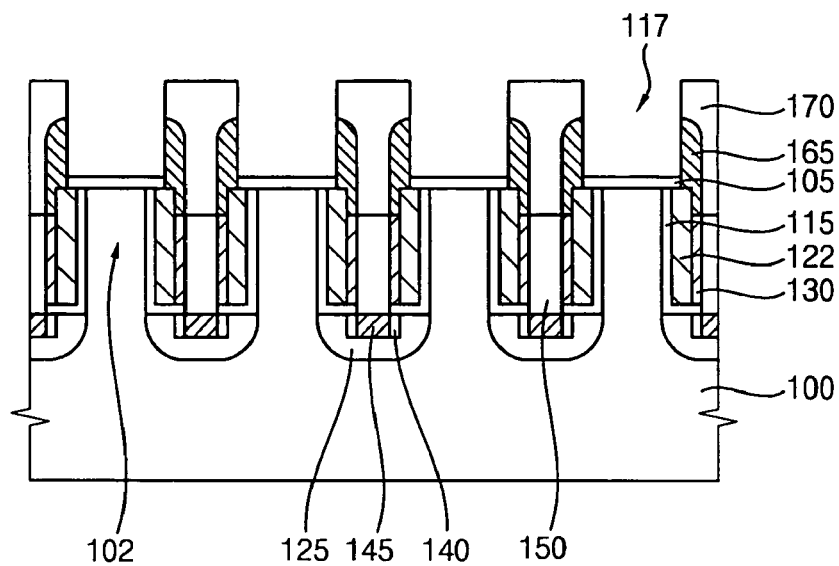

Referring to FIG. 13, the hard mask 110 may be removed, e.g., completely removed, to form an opening 117. For example, a bottom of the opening 117 may be defined by the pad oxide 115, and sidewalls of the opening 117 may be defined by the conductive spacer 165 and the second insulating interlayer 170. The hard mask 110 may be removed by forming a dummy layer and a mask on the second insulating interlayer 170 and etching the hard mask 110 using the dummy layer and the mask.

Figure 14:
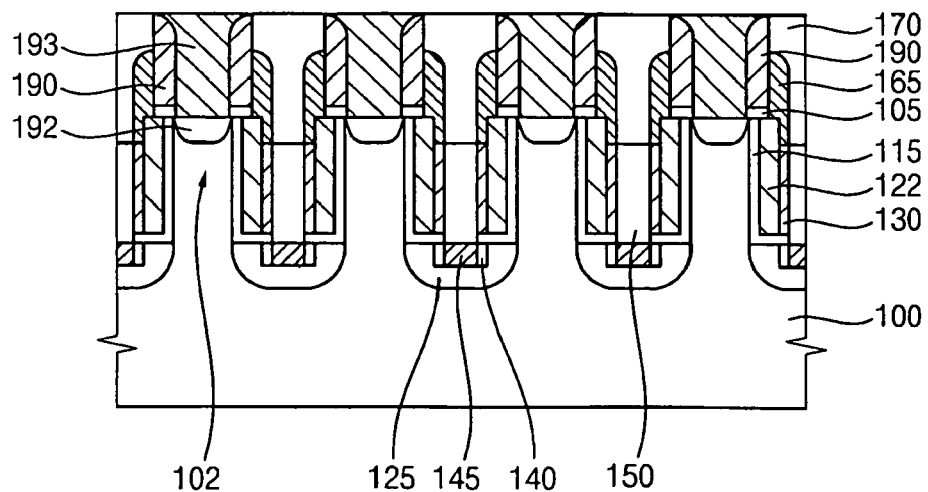

Referring to FIG. 14, a second spacer 190 may be formed on a sidewall of the opening 117, e.g., on the conductive spacer 165. The second spacer 190 may be formed using, e.g., a nitride. The second spacer 190 may enclose the conductive spacer 165, thereby electrically insulating the conductive spacer 165 from a contact 193 formed subsequently. The pad oxide layer 105 may be partially removed using the second spacer 190 as an etching mask. Impurities may be implanted onto the pillar 102 to form a second impurity region 192. A channel region may be formed in the pillar 102 between the first and second impurity regions 125 and 192. The gate structure, the first and second impurity regions 125 and 192, and the channel region may form a transistor. The contact 193 may be formed to fill up the remaining portion of the opening 117, e.g., between the second spacers 190 in each opening 117. The contact 193 may be formed, e.g., by depositing doped polysilicon on the second impurity region 192 and planarizing the doped polysilicon.

Figure 15:
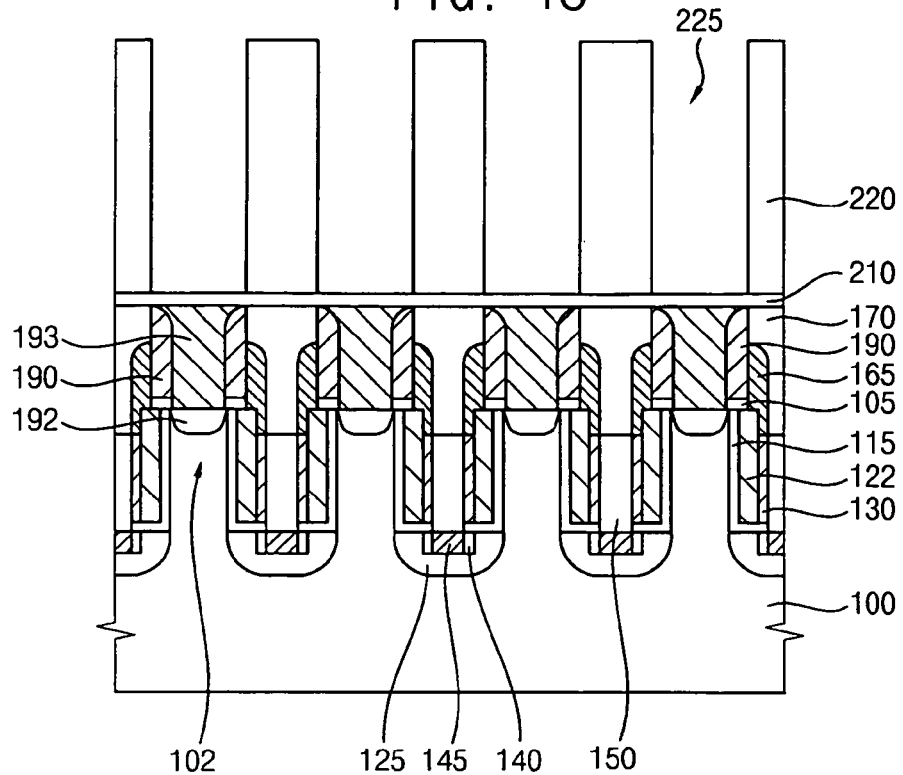

Referring to FIG. 15, a first etch stop layer 210 may be formed on the second insulating interlayer 170, the second spacer 190, and the contact 193. The first etch stop layer 210 may be formed, e.g., by a chemical vapor deposition (CVD) process using silicon nitride. A first mold layer 220 may be formed on the first etch stop layer 210. The first mold layer 220 may be formed to have a thickness, i.e., a distance along the vertical direction, of about 4,000 angstroms to about 10,000 angstroms. The first mold layer 220 may be formed, e.g., by a CVD process.

The mold layer 220 may be partially removed to form a first hole 225 over the contact 193, e.g., each first hole 225 may overlap a corresponding contact 193 with second spacers 190. The mold layer 220 may be removed, e.g., by a dry etching process using the first etch stop layer 210 as an etch stop layer.

Figure 16:
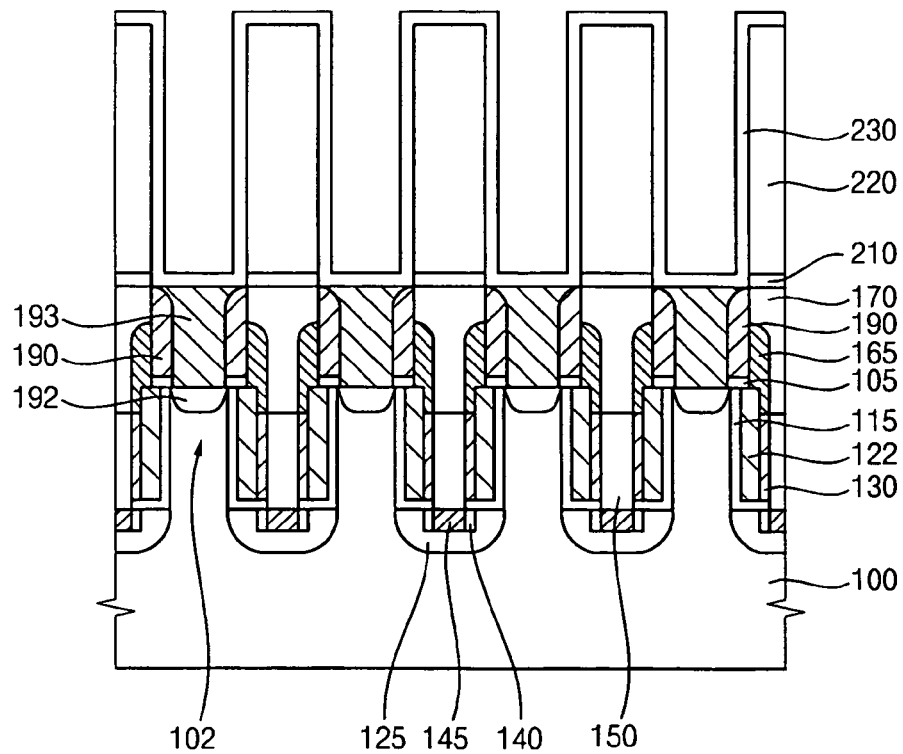

Referring to FIG. 16, a portion of the first etch stop layer 210 on the contact 193, e.g., a portion of the first etch stop layer 210 inside the first hole 125, may be removed. A first lower electrode 230 may be formed, e.g., conformally, on the first mold layer 220 and first holes 225. In other words, the first lower electrode 230 may be formed on, e.g., directly on, the contact 193, a sidewall of the first hole 225, and the first mold layer 220. The first lower electrode 230 may be formed using a metal, e.g., one or more of titanium nitride, titanium, tantalum nitride, platinum, etc. The first lower electrode 230 may be, e.g., a cylindrical lower electrode.

Figure 17:
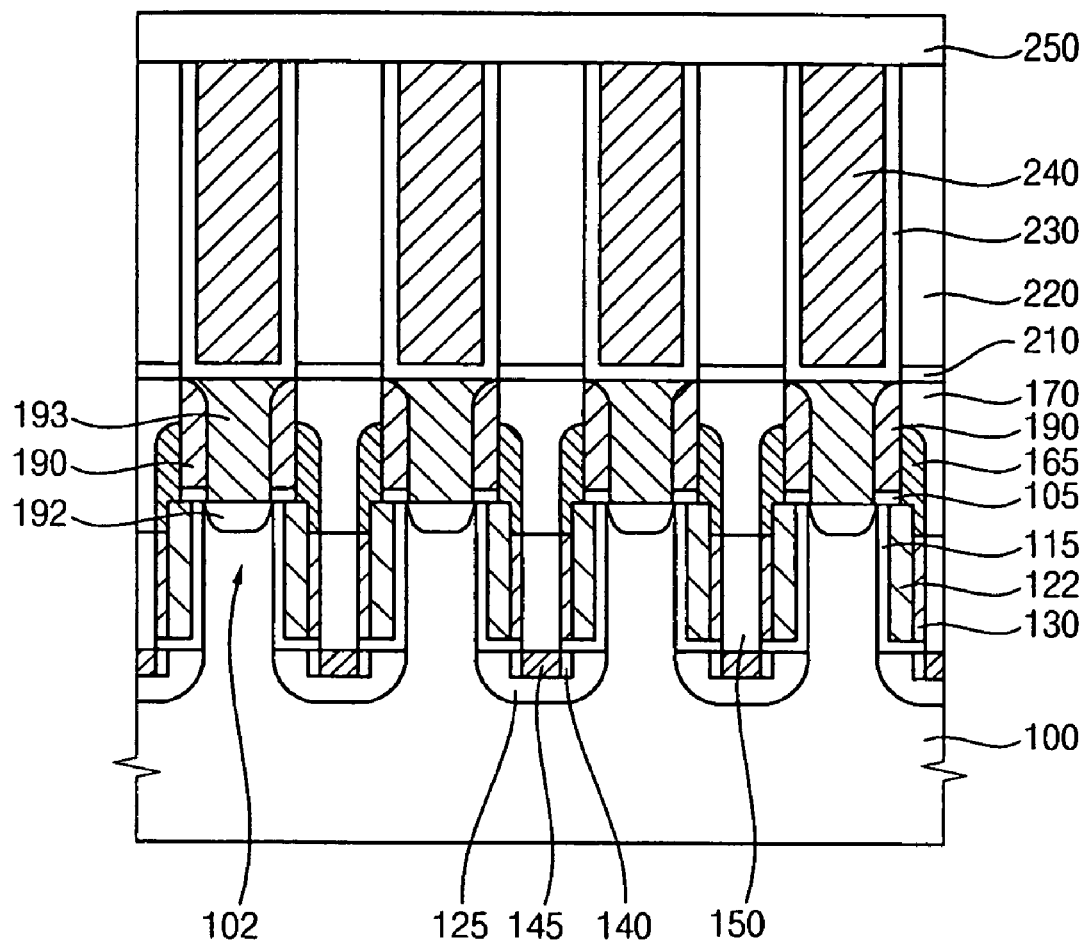

Referring to FIG. 17, a filler layer 240 may be formed on the lower electrode 230 to fill, e.g., completely fill, the remaining portion of the first hole 225. The filler layer 240 may be formed using a material having good gap filling characteristics, e.g., torene silazene (TOSZ). In an example embodiment, an oxide layer may be further formed on the TOSZ layer by, e.g., an atomic layer deposition (ALD) process. The filler layer 240 may have an etching selectivity with respect to the first mold layer 220.

Upper portions of the filler layer 240 and the lower electrode 230 may be removed, e.g., by a CMP process and/or an etch back process, so that upper surfaces of the filler layer 240, lower electrode 230, and first mold layer 220 may be substantially coplanar. Accordingly, the lower electrode 230 may be isolated by the first mold layer 220, e.g., adjacent lower electrodes 230 may be isolated from each via the first mold layer 220.

A second etch stop layer 250 may be formed on the filler layer 240, the first lower electrode 230, and the first mold layer 220. The second etch stop layer 250 may be formed, e.g., by a CVD process using a nitride. The second etch stop layer 250 may be formed to have a thickness larger than that of the first etch stop layer 210. In an example embodiment, the second etch stop layer 250 may be formed to a thickness of about 200 angstroms to about 500 angstroms. The filler layer 240 and the second etch stop layer 250 may support the first lower electrode 230 from falling down during subsequent processing.

Figure 18:
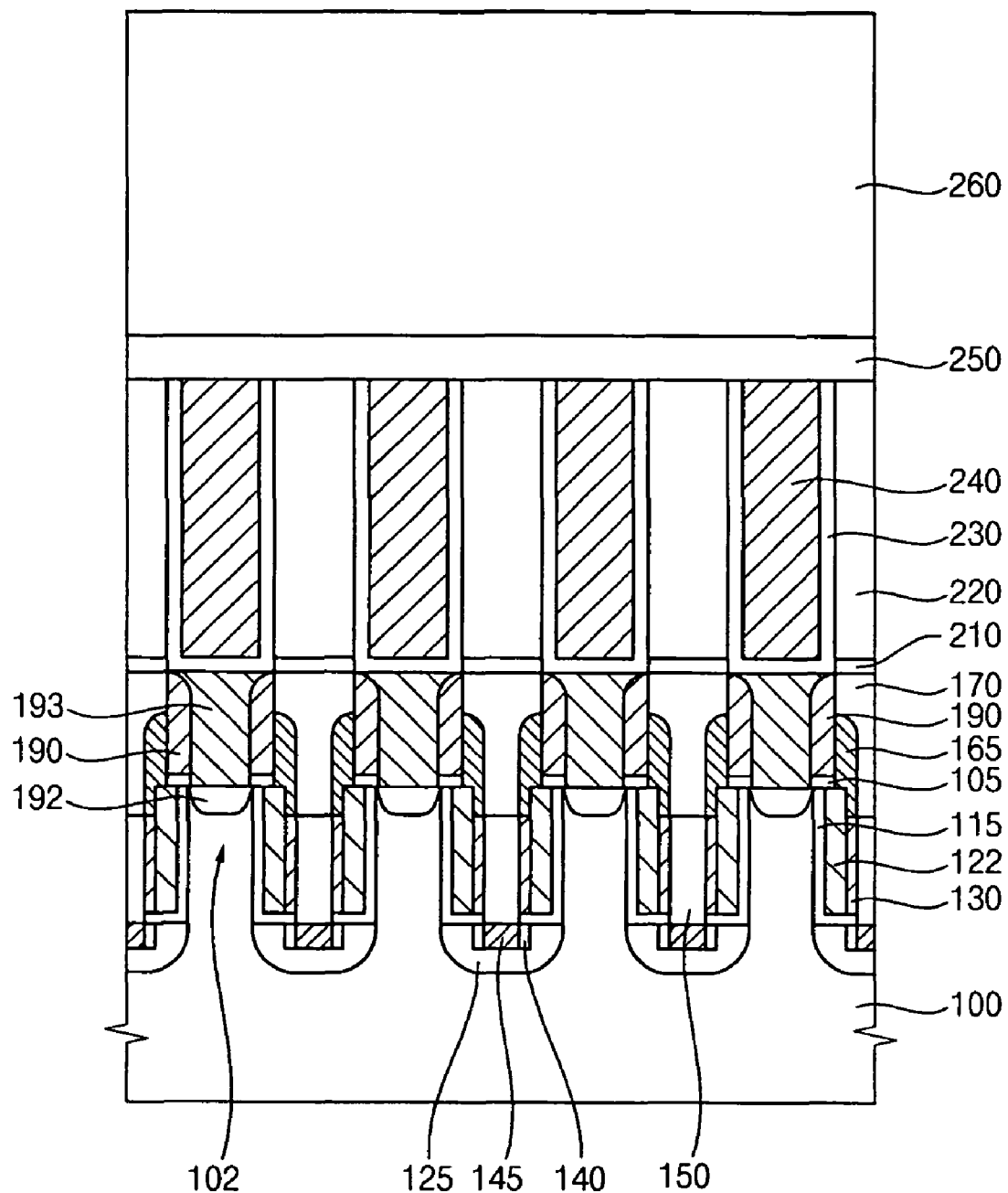

Referring to FIG. 18, a second mold layer 260 may be formed on the second etch stop layer 250. For example, the second mold layer 260 may be formed to have a thickness that is substantially equal to or is larger than the thickness of the first mold layer 220. For example, the second mold layer 260 may have a thickness of about 10,000 angstroms to about 15,000 angstroms. The second mold layer 260 may be formed, e.g., by a CVD process.

Figure 19:
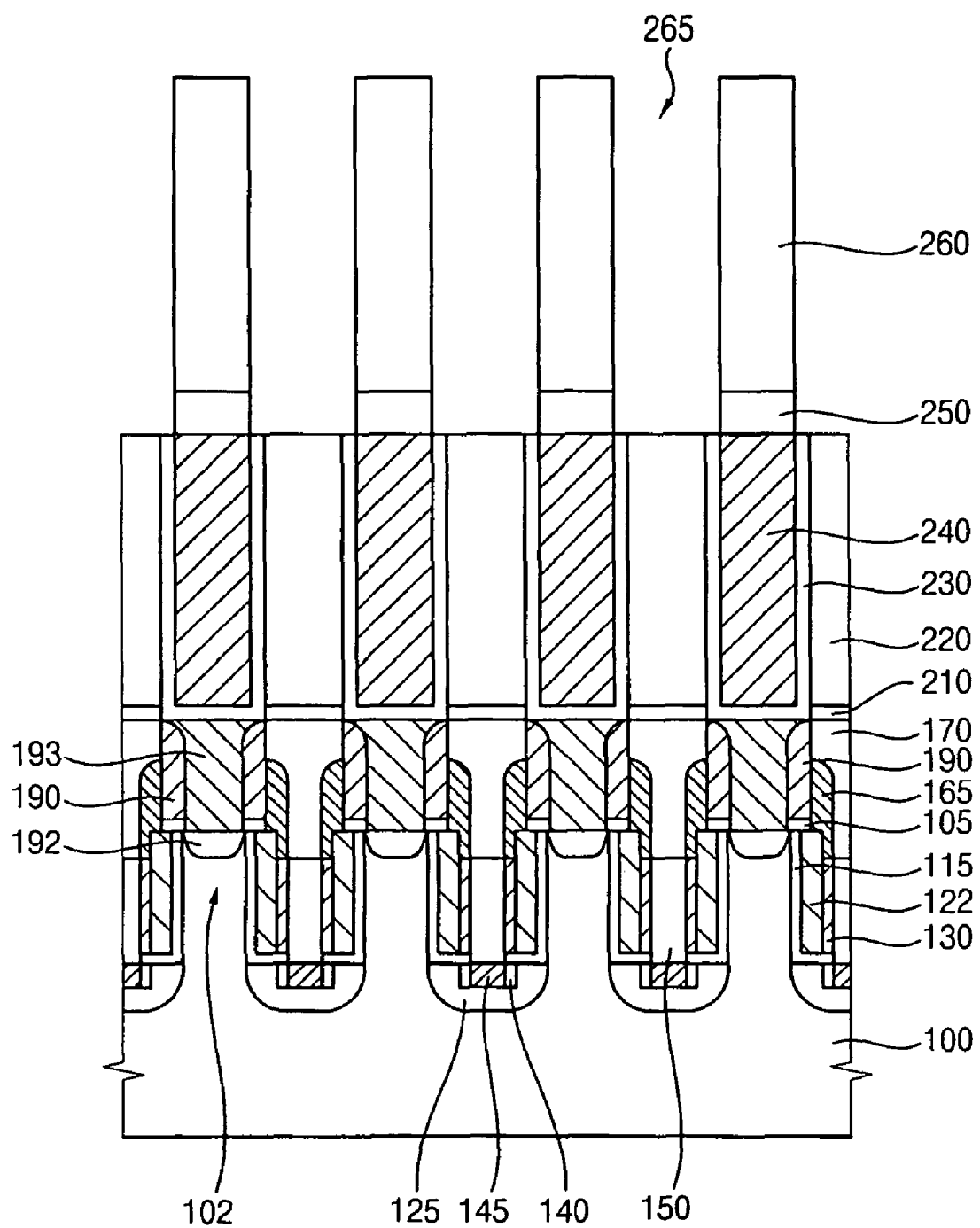

Referring to FIG. 19, a second hole 265 may be formed through the second mold layer 260 and the second etch stop layer 250, e.g., each second hole 265 may be between two adjacent portions of the second mold 260. The second hole 265 may be formed over, e.g., completely overlap, a corresponding portion of the first mold layer 220, i.e., a portion of the first mold layer 220 between two adjacent first lower electrodes 230. In other words, the second hole 265 may overlap a region between two adjacent first lower electrodes 230.

Figure 20:
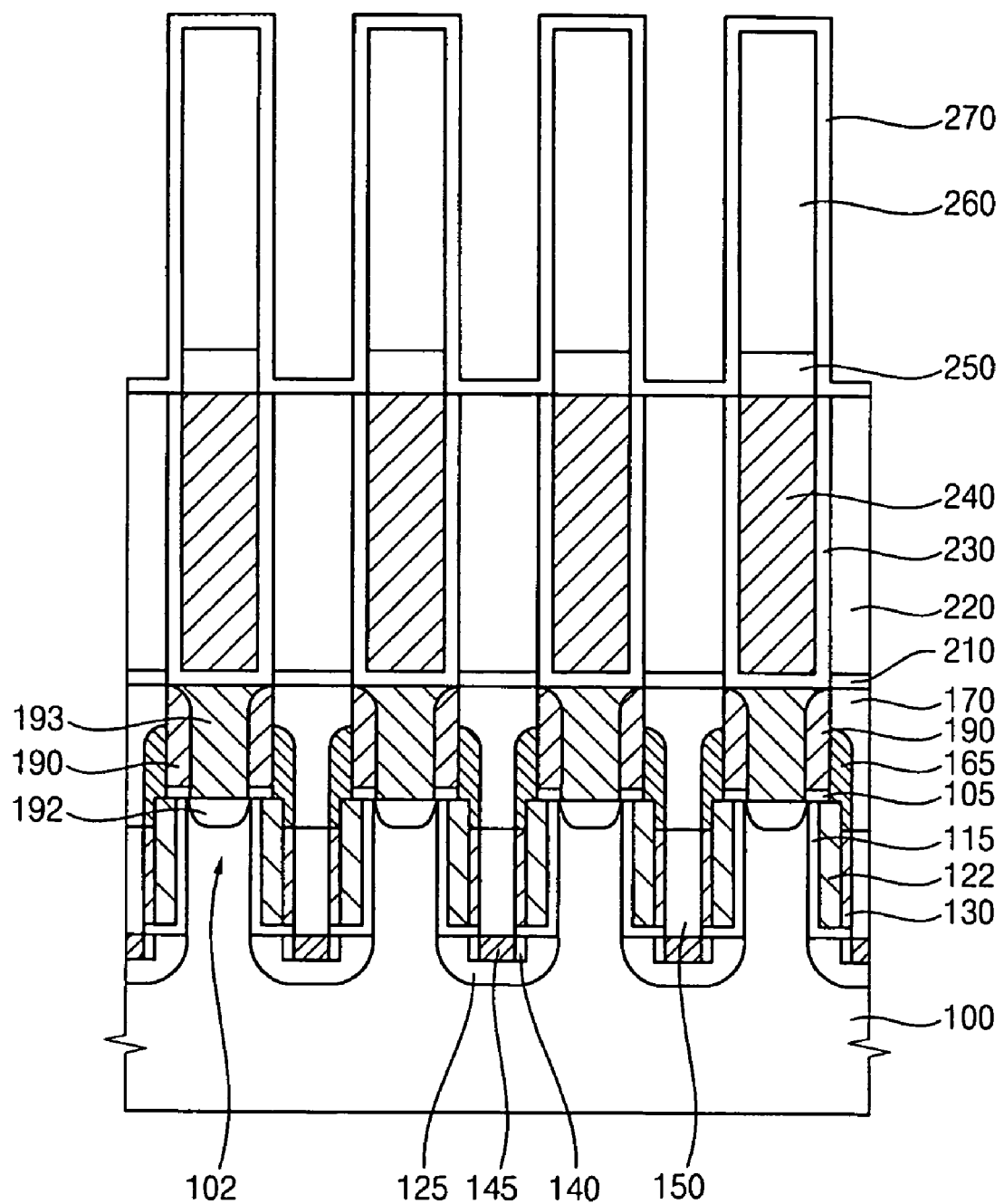

Referring to FIG. 20, a second lower electrode 270 may be formed, e.g., conformally, on a bottom and sidewalls of the second hole 265 and on the second mold layer 260. The second electrode 270 may be formed using a metal, e.g., one or more of titanium nitride, titanium, tantalum nitride, platinum, etc. The first and second lower electrodes 230 and 270 may form a lower electrode structure. In an example embodiment, the second lower electrode 270 may have a thickness, i.e., a height measured along the vertical direction, larger than that of the first lower electrode 230.

Figure 21:
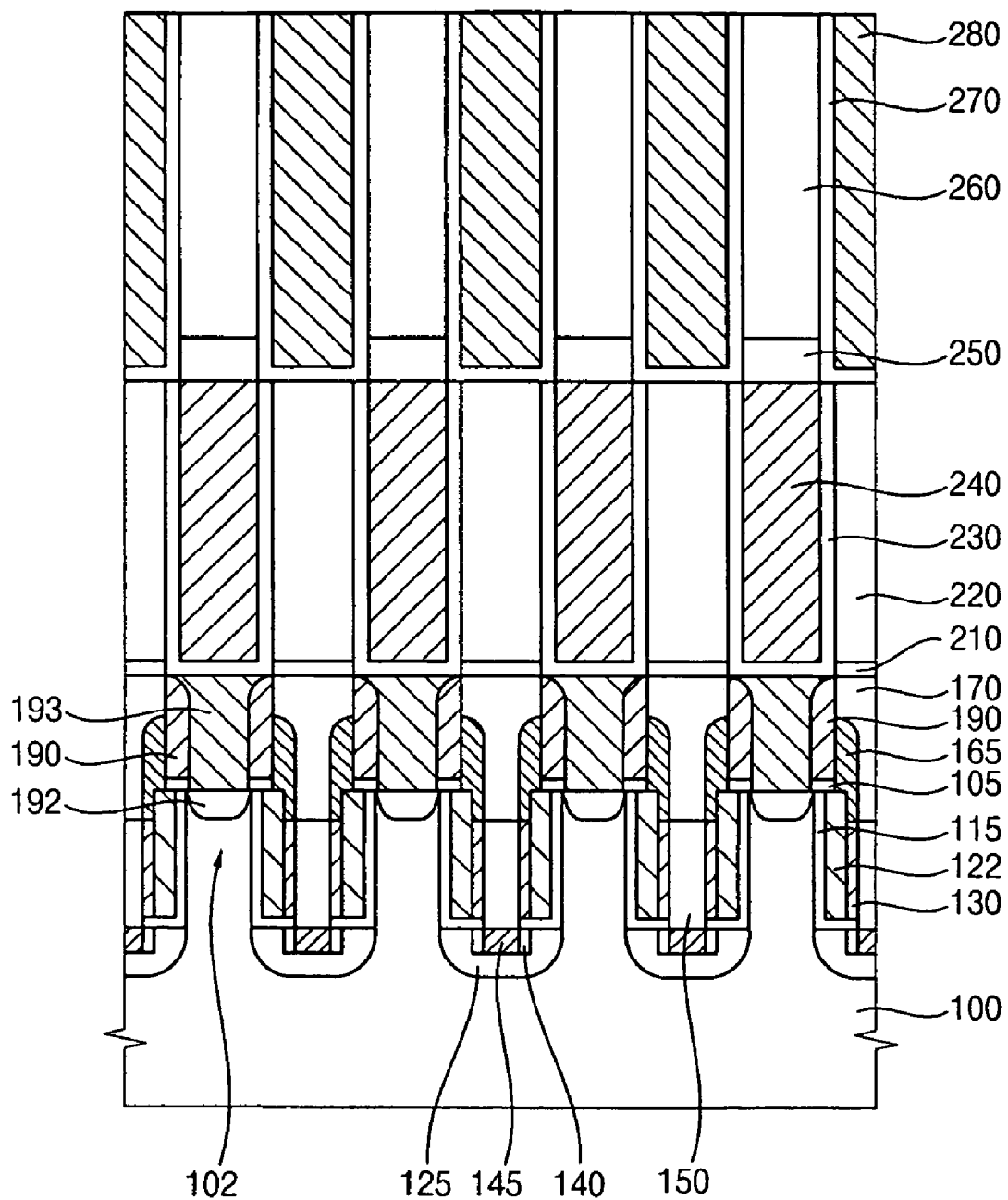

Referring to FIG. 21, a sacrificial layer 280 may be formed on the second lower electrode 270 to fill, e.g., completely fill, the remaining portion of the second hole 265. The sacrificial layer 280 may be formed using a material having an etching selectivity with respect to the second mold layer 260. For example, the sacrificial layer 280 may be formed using an oxide or an organic layer. Upper portions of the sacrificial layer 280 and the second lower electrode 270 may be removed, e.g., by a CMP process and/or an etch back process, so that the second lower electrode 270 may be isolated by the second mold layer 260. A top portion of the second lower electrode 270 may be formed to have a round shape by performing a wet-etching process on the sacrificial layer 280 and on a top portion of the second lower electrode 270. When the top portion of the second lower electrode 270 is sharp, i.e., not rounded, a dielectric layer of a capacitor may be broken or a leakage current from the top portion of the second lower electrode 270 may be generated.

Figure 22:
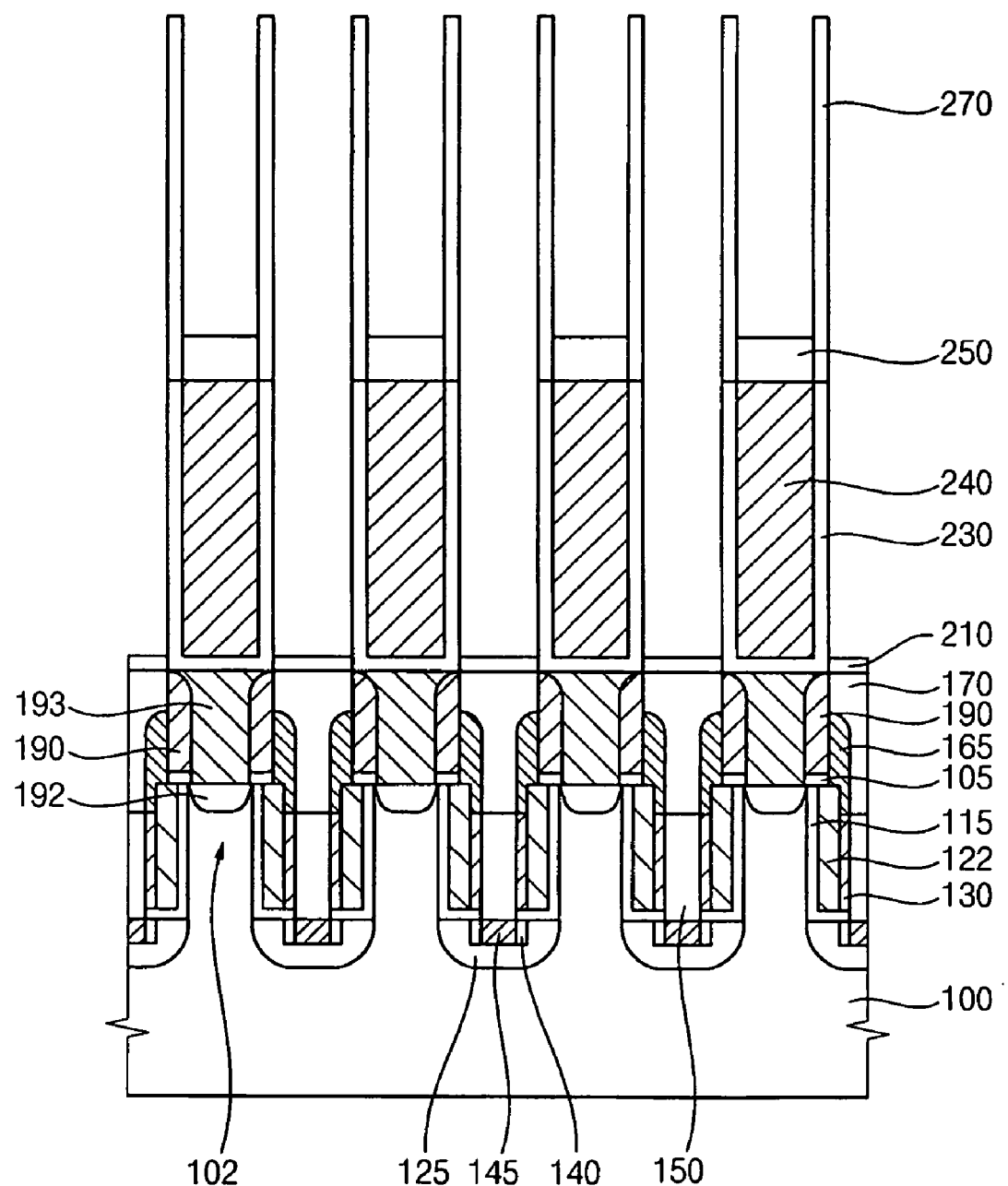

Referring to FIG. 22, the sacrificial layer 280 may be removed, and a portion of the second lower electrode 270 on the first mold layer 220 may be removed. The first and second mold layers 220 and 260 may be removed from the semiconductor substrate 100. For example, the first and second mold layers 220 and 260 may be removed by a lift-off process using a limulus amoebocyte lysate (LAL) solution that may include deionized water, ammonium hydrofluoride, and hydrofluoric acid. Accordingly, as illustrated in FIG. 22, the lower electrode structures may be formed by finalizing the second lower electrodes 270 on the first lower electrodes 260. For example, each lower electrode structure may include a second lower electrode 270 on, e.g., directly on, a first lower electrode 260, such that the first and second lower electrodes 230 and 270 may completely overlap each other, i.e., respective sidewalls of the first and second lower electrodes 230 and 270 may be aligned with each other to define coplanar surfaces. Removing the first and second mold layers 220 and 260 may be carefully performed, such that adjacent lower electrode structures may not contact each other or fall down.

Conventionally, adjacent lower electrodes of cylindrical capacitors may include a support structure on outer walls of the cylindrical capacitor, i.e., between adjacent cylindrical capacitors. For example, the conventional support structure may have a ladder shape or a ring shape. Conventional support structures on outer walls of the cylindrical capacitors may require additional processes for forming the support structure. Further, because the conventional support structure is formed on outer walls of the cylindrical capacitors, i.e., between adjacent cylindrical capacitors, the process margin may be reduced.

According to example embodiments, the support structure may be formed inside the lower electrode structures of the capacitors. In particular, the support structure according to example embodiments may include the filler layer 240 and the second etch stop layer 250. That is, the filler layer 240 may be formed inside the first lower electrode 230, and the second etch stop layer 250 may be formed inside the second lower electrode 270 on the filler layer 240. Accordingly, the filler layer 240 and the second etch stop layer 250 may define a support structure inside each lower electrode structure, so that a support structure for each capacitor, e.g., a cylindrical capacitor with a high aspect ratio, may be an internal structure inside the capacitor. Thus, adjacent capacitors, e.g., cylindrical capacitors with a high aspect ratio, may extend to a required height with sufficient support therein and without falling or leaning on each other, while having a reduced distance therebetween, since an additional space for a support structure therebetween may not be required.

A height of the support structure according to example embodiments, i.e., a vertical distance as measured from the contact 193 in an upward direction, may be adjusted relative to a total height of the lower electrode structure of the capacitor to provide sufficient support and high capacitance. If the height of the support structure is too large, the capacitor may not have high capacitance, and if the height of the support structure is too low, the support structure may provide insufficient support for the capacitor. The height of the support structure may be measured from a bottom surface, i.e., a surface facing the contact 193, of the filler layer 240 to an upper surface of the second etch stop layer 250, i.e., a surface facing away from the filler layer 240.

When the lower electrode structure of the capacitor has a height of about 20,000 angstroms or higher, and the support structure has a height of about 20% to about 50% of the height of the lower electrode structure, the capacitor may be sufficiently supported by the support structure, i.e., may not lean or fall down, and may have a relatively high capacity. Thus, when the filler layer 240 has a height of about 4,000 angstroms to about 10,000 angstroms, i.e., a substantially same height as that of the first mold 220, and the second etch stop layer 250 has a height of about 200 angstroms to about 500 angstroms, the capacitor may not lean toward adjacent capacitors and may have high capacitance. The above-mentioned height ratio is an example and may be varied according to the design rule.

Figure 23:
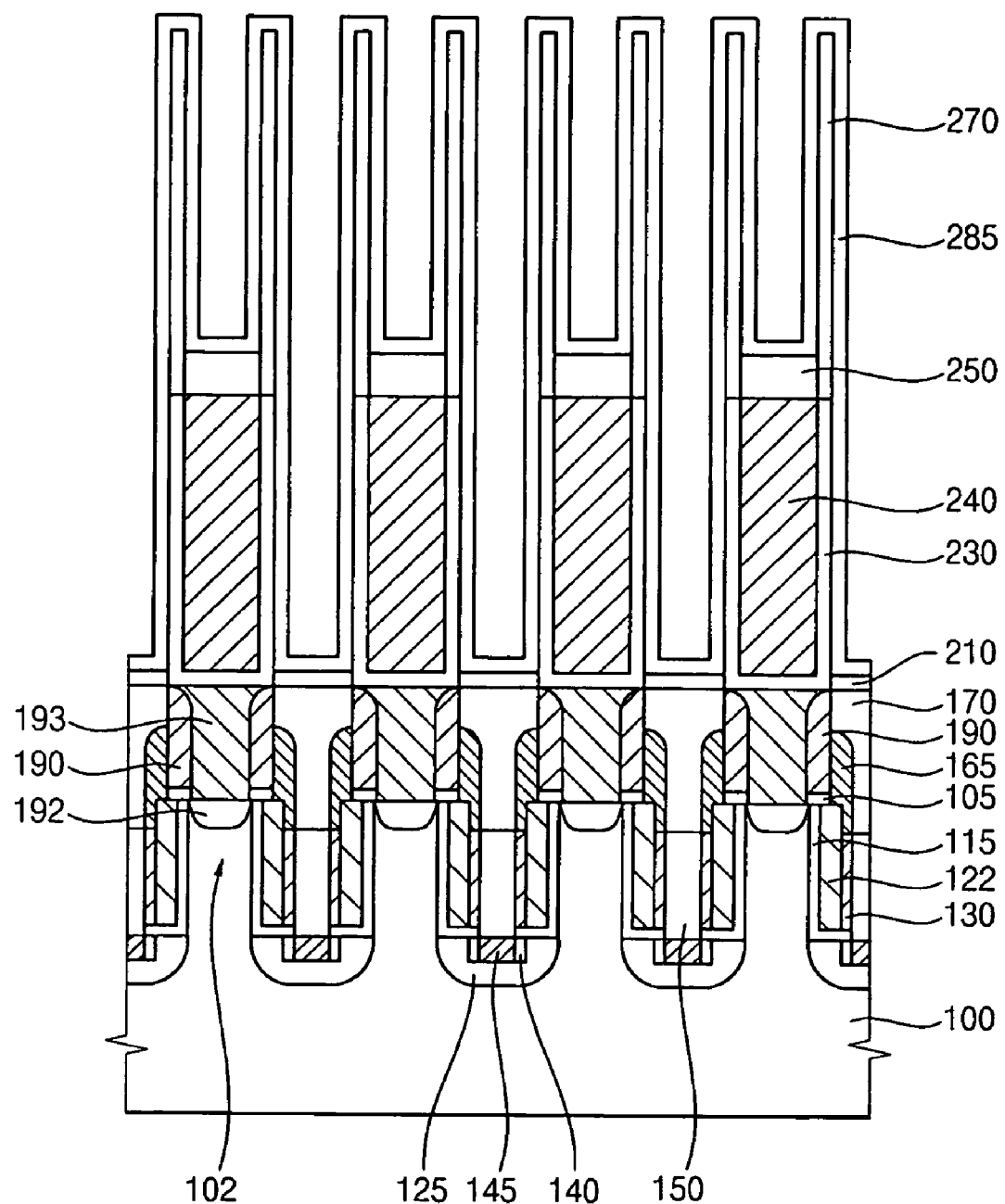
Figure 24:
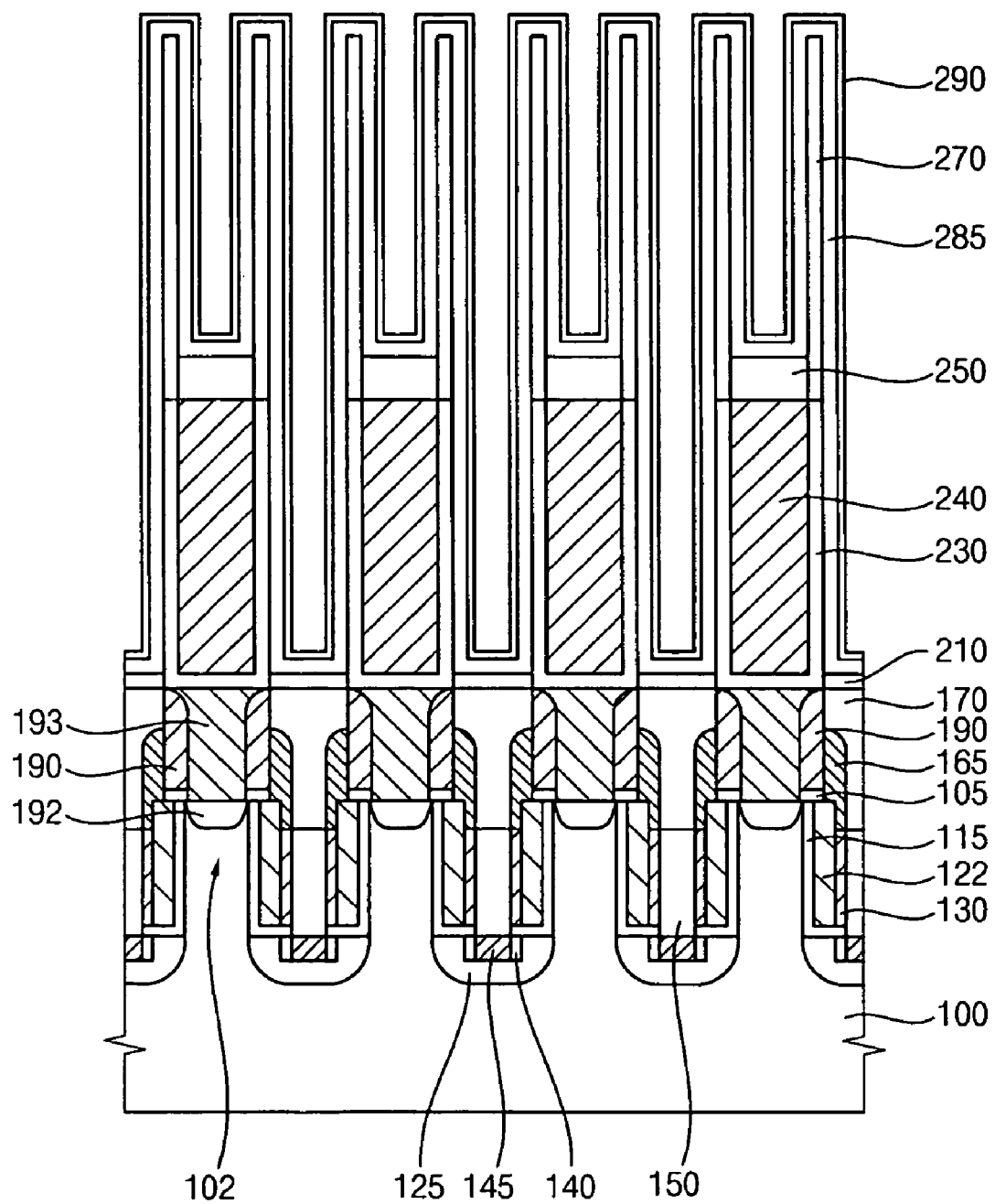

Referring to FIGS. 23 and 24, a dielectric layer may be formed on the lower electrode structure, the second etch stop layer 250, and the first etch stop layer 210. In an example embodiment, the dielectric layer may have a single layer structure, e.g., a zirconium oxide layer. In another example embodiment, the dielectric layer may have a multi-stacked structure, e.g., a zirconium oxide layer and a zirconium carbo-oxynitride layer.

Hereinafter, an exemplary method of forming the multi-stacked dielectric layer of the zirconium oxide layer and the zirconium carbo-oxynitride layer will be described. Referring to FIG. 23, a zirconium oxide layer 285 may be formed, e.g., conformally, on the lower electrodes structure. First, a first zirconium source, e.g., tetrakis (ethylmethylamino) zirconium ($Zr[N(CH_3)(CH_2CH_3)]_4$, TEMAZ), may be provided in a process chamber, where the semiconductor substrate 100 may be loaded to form a chemical adsorption layer of the first zirconium source on the lower electrode structure, second etch stop layer 250 and first etch stop layer 210. Next, the process chamber may be purged using an inactive gas, e.g., Ar, He or $N_2$, to remove a non-adsorbed portion of the first zirconium source. Thus, a first atomic layer may be formed on the lower electrode structure, the second etch stop layer 250 and the first etch stop layer 210. In the above process, the first zirconium source may be provided at a low temperature of about 250° C., so that the first atomic layer may be deposited uniformly on the whole portions of the cylindrical capacitor. Thus, the first atomic layer may have good step coverage characteristics.

Next, after changing the temperature of the process chamber to about 275° C., a first oxidizing gas, e.g., $O_2$, $O_3$ or $H_2O$, may be injected into the process chamber to oxidize the first atomic layer, i.e., the chemical adsorption layer of the first zirconium source. In the present embodiment, a strong oxidation agent, e.g., ozone ($O_3$), may be injected. Thus, carbon and nitrogen of the first zirconium source may be removed, thereby forming the zirconium oxide layer 285. The reaction of the first zirconium source and the first oxidizing gas may be activated by plasma. Plasma may be provided in the process chamber during or after the first oxidizing gas is provided. A purging gas, e.g., Ar, He or $N_2$, may be injected into the process chamber to remove any remaining first oxidizing gas from the chamber. By repeating this sequence, the first zirconium oxide layer 285 may have a predetermined thickness. In the present embodiment, about 100 cycles to about 150 cycles may be performed to form a zirconium oxide layer 285 having a thickness of about 100 angstroms to about 150 angstroms.

The zirconium oxide layer 285 may have good step coverage characteristics because the first zirconium source may be provided at a low temperature and the oxidation process may be performed at a high temperature.

Referring to FIG. 24, a zirconium carbo-oxynitride layer 290 may be formed on the first zirconium oxide layer 285. The zirconium carbo-oxynitride layer 290 may be formed by an in-situ process with the formation of the first zirconium oxide layer 285 using a same ALD apparatus. That is, a second zirconium source used for forming the zirconium carbo-oxynitride layer 290 may be provided directly after purging the process chamber to remove non-reacted first oxidizing gas.

For example, a second zirconium source, e.g., TEMAZ, may be provided in the process chamber to form a chemical adsorption layer of the second zirconium source on the first zirconium oxide layer 285. The process chamber may be purged using an inactive gas, e.g., Ar, He or $N_2$, to remove a non-adsorbed portion of the second zirconium source. Thus, a second atomic layer may be formed on the zirconium oxide layer 285. In the above process, the second zirconium source may be provided at a low temperature of about 250° C., so that the second atomic layer may be deposited uniformly on the whole portions of the first atomic layer. Thus, the second atomic layer may have good step coverage characteristics.

After changing the temperature of the process chamber to about 275° C., a second oxidizing gas, e.g., $O_2$, $O_3$ or $H_2O$, may be injected into the process chamber to oxidize the chemical adsorption layer of the second zirconium source. In the present embodiment, a weak oxidation agent, e.g., oxygen ($O_2$), may be injected. Thus, the oxidized adsorption layer of the second zirconium source may have a reduced amount of carbon and nitrogen relative to the zirconium source. The second oxidizing gas may partially take part in the reaction with the adsorption layer of the second zirconium source. The rate of the chemical reaction between the second zirconium source and the second oxidizing gas may depend on the pressure and/or the temperature, and the reaction degree may also vary depending on the oxidizing ability of the oxidizing gas. Thus, the pressure, the temperature and/or the type of the oxidizing gas may be properly adjusted such that the zirconium carbo-oxynitride layer 290 may be formed to have predetermined amounts of carbon and nitrogen.

A purging gas, e.g., Ar, He or $N_2$, may be injected into the process chamber to remove any remaining oxidizing gas from the chamber. After purging the process chamber, a nitriding gas may be injected into the process chamber. Examples of the nitriding gas may include one or more of NO, $NO_2$, $NH_3$, etc. While the nitriding gas is provided, plasma may also be provided in the process chamber. The oxidized adsorption layer of the zirconium source may be nitrided by the nitriding gas and plasma, and binding forces between zirconium, oxygen, carbon and nitrogen may increase to form a zirconium carbo-oxynitride layer 290 having improved stability. When the amount of nitrogen included in the zirconium carbo-oxynitride layer 290 is excessive, electrical characteristics, e.g., the dielectric constant, equivalent oxide thickness or leakage current, may be deteriorated. Thus, the amount of the nitriding gas that is provided may be limited. After providing the nitriding gas, a purging gas may be injected into the process chamber to remove a non-reacted portion of the nitriding gas. The oxidation process may be performed at a high temperature, so that the zirconium carbo-oxynitride layer 290 may have good step coverage characteristics.

The zirconium carbo-oxynitride layer 290 thus formed may have a formula of $ZrO_{2-x-y}C_xN_y$. A basic atomic layer may be formed on the zirconium oxide layer 285 by performing one cycle of ALD process. The zirconium carbo-oxynitride layer 290 may be formed to a predetermined thickness by repeating a plurality of the cycles. In the present embodiment, about 20 cycles to about 50 cycles may be performed to form the zirconium carbo-oxynitride layer 290 having a thickness of about 20 angstroms to about 50 angstroms. Therefore, the multi-stacked dielectric layer of the zirconium oxide layer 285 and the zirconium carbo-oxynitride layer 290 may be formed on the lower electrode structure, as illustrated in FIGS. 23-24.

Alternatively, the dielectric layer may include a single layer or more than two layers. For example, the dielectric layer may have a structure of zirconium oxide/aluminum oxide/zirconium oxide ($ZrO_2/Al_2O_3/ZrO_2$, ZAZ), zirconium oxide/zirconium carbo-oxynitride/zirconium oxide ($ZrO_2/ZrOCN/ZrO_2$, ZNZ), zirconium oxide/zirconium carbo-oxynitride/tantalum oxide ($ZrO_2/ZrOCN/TaO_2$, ZNT), $Hf_2O_3$, etc.

When the source gas is provided at a low temperature and the oxidizing gas is provided at a high temperature, the dielectric layer in example embodiments may have good step coverage characteristics.

Figure 25:
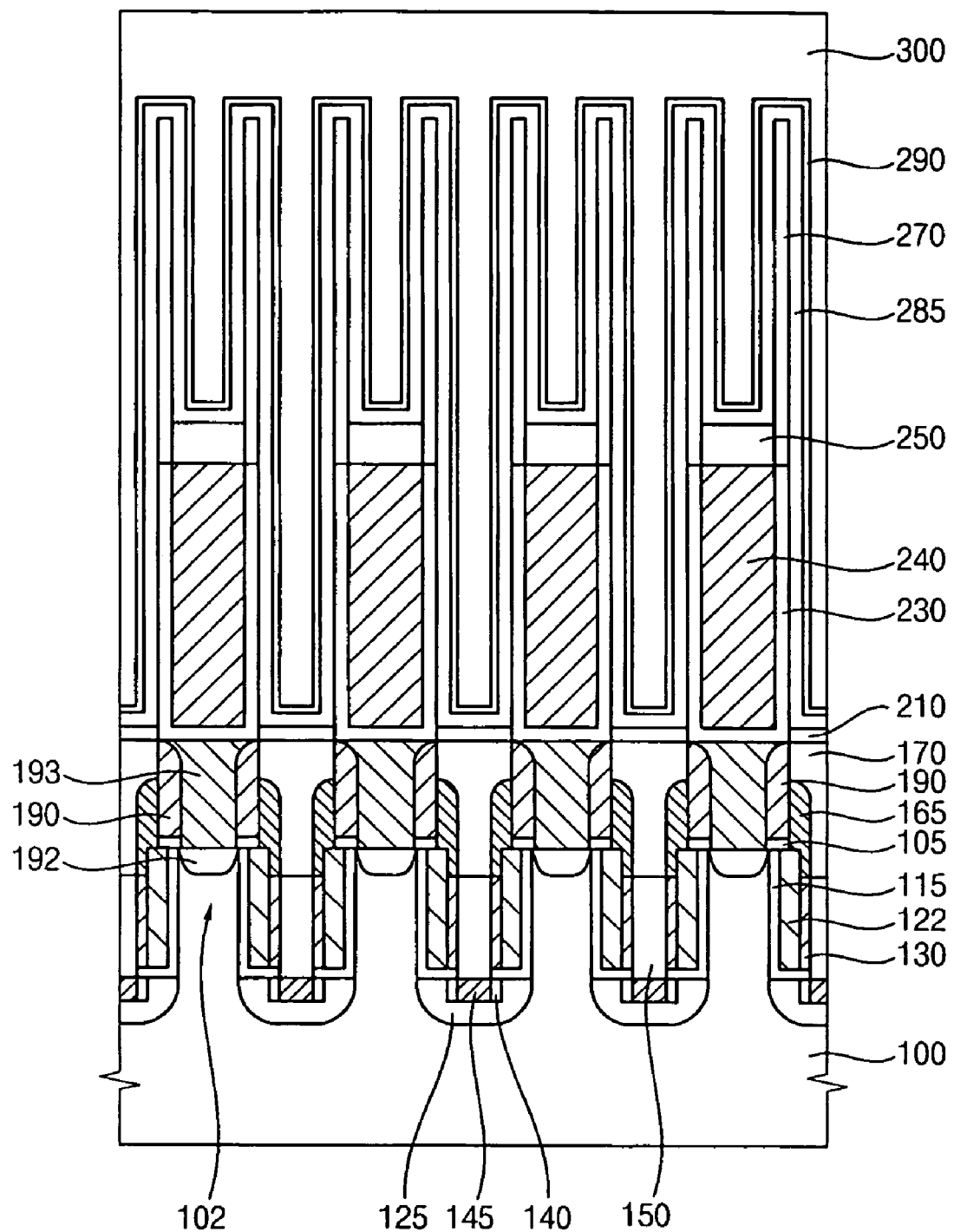

Referring to FIG. 25, an upper electrode 300 may be formed on the dielectric layer. The upper electrode 300 may be formed using a metal, e.g., cobalt, titanium, nickel, etc.

The capacitor including the lower electrode structure, the dielectric layer and the upper electrode 300 may have a cylindrical shape. At a lower portion of the capacitor, i.e., on the first lower electrode 230, the dielectric layer may be formed only on the outer wall of the lower electrode structure, i.e., on the outer surface of the first lower electrode 230 facing away from the filler layer 240, because the support structure including the filler layer 240 and the second etch stop layer 250 fills the lower inner space of the cylindrical capacitor, i.e., the inner space of the first lower electrode 230. At an upper portion of the capacitor, i.e., on the second lower electrode 270, the dielectric layer may be formed on both of the inner and outer walls of the lower electrode structure.

According to the above shape, the capacitor may not lean or fall down, and thus 2-bit fail may not occur.

Additional insulating interlayers and metal wirings may be further formed to complete the semiconductor device having good electrical characteristics.

Figure 26:
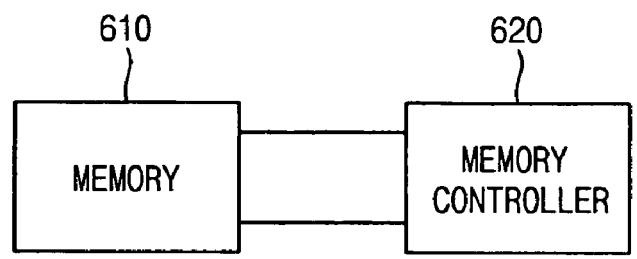
FIG. 26 illustrates a block diagram of a system including a semiconductor device in accordance with example embodiments.

FIG. 26 illustrates a block diagram of a system including a semiconductor device in accordance with example embodiments.

Referring to FIG. 26, a memory controller 620 may be connected to a memory 610. The memory 610 may be a dynamic random access memory (DRAM) device including a cylindrical capacitor having a support structure according to example embodiments. The memory controller 620 may provide the memory 610 with input signals to control operations of the memory 610. For example, in a memory card that includes the memory controller 620 and the memory 610, the memory controller 620 may transfer commands of a host to the memory 610 to control input/output data, and/or the memory controller 620 may control various data from the memory 610 based on an applied control signal. Such a structure or a relation may be employed in various digital devices using memory as well as a simple memory card.

Figure 27:
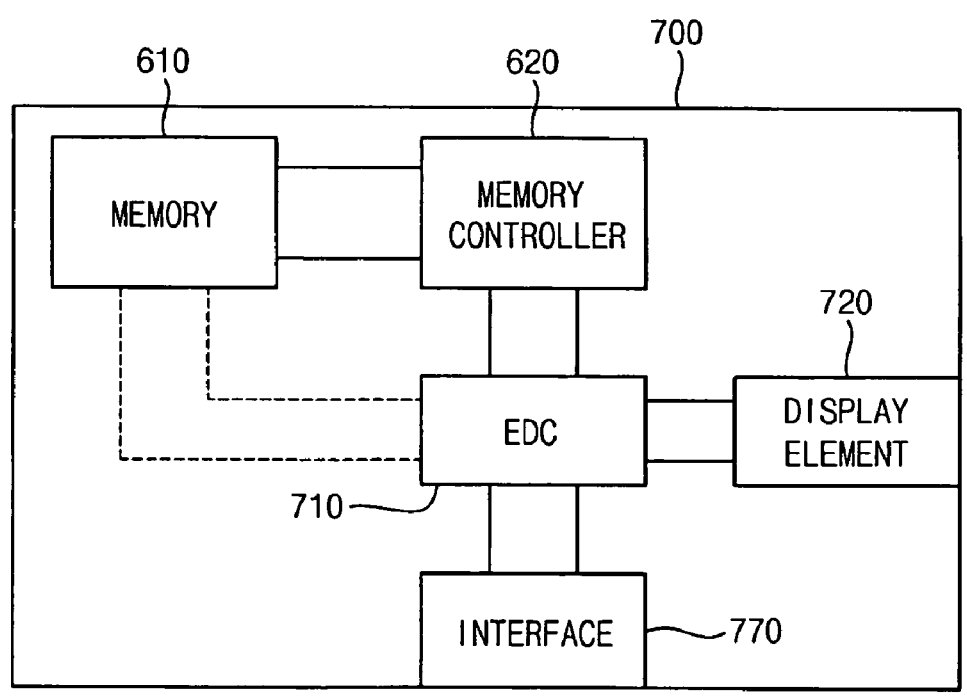
FIG. 27 illustrates a block diagram of a system including a semiconductor device in accordance with other example embodiments.

FIG. 27 illustrates a block diagram of another system including a semiconductor device in accordance with example embodiments.

Referring to FIG. 27, a portable device 700 may be provided according to example embodiments. The portable device 700 may include the memory 610, e.g., a DRAM device including a cylindrical capacitor having a support structure according to example embodiments. Examples of the portable device 700 may include an MP3 player, a video player, a portable multi-media player (PMP), etc.

The portable device 700 may include the memory 610, the memory controller 620, an encoder/decoder (EDC) 710, a display element 720, and an interface 730. Data may be input to or output from the memory 610 by way of the memory controller 620. As illustrated with the dashed lines of FIG. 27, data may be directly input from the EDC 710 to the memory 610, or data may be directly output from the memory 610 to the EDC 710.

The EDC 710 may encode data to be stored in the memory 610. For example, the EDC 710 may execute encoding for storing audio data and/or video data in the memory 610 of an MP3 player or a PMP player. Further, the EDC 710 may execute MPEG encoding for storing video data in the memory 610. Moreover, the EDC 710 may include multiple encoders to encode different types of data depending on their formats. For example, the EDC 710 may include an MP3 encoder for encoding audio data and an MPEG encoder for encoding video data.

The EDC 710 may also decode data output from the memory 610. For example, the EDC 710 may execute MP3 decoding to decode audio data from the memory 610. Further, the EDC 710 may execute MPEG decoding to decode video data from the memory 610. Moreover, the EDC 710 may include multiple decoders to decode different types of data depending on their formats. For example, the EDC 710 may include an MP3 decoder for audio data and an MPEG decoder for video data.

In other embodiments, the EDC 710 may include only a decoder. For example, encoded data may be input to the EDC 710, and then the EDC 710 may decode the input data for transfer into the memory controller 620 or the memory 610.

The EDC 710 may receive data to be encoded or data being encoded by way of the interface 730. The interface 730 may comply with established standards (e.g., FireWire, USB, etc.); accordingly, the interface 730 may include a FireWire interface, a USB interface, etc., and data may be output from the memory 610 by way of the interface 730.

The display element 720 may display a representation of user data that may be output from the memory 610 and decoded by the EDC 710. Examples of the display element 720 may include a speaker outputting an audio representation of the data, a display screen outputting a video representation of the data, etc.

Figure 28:
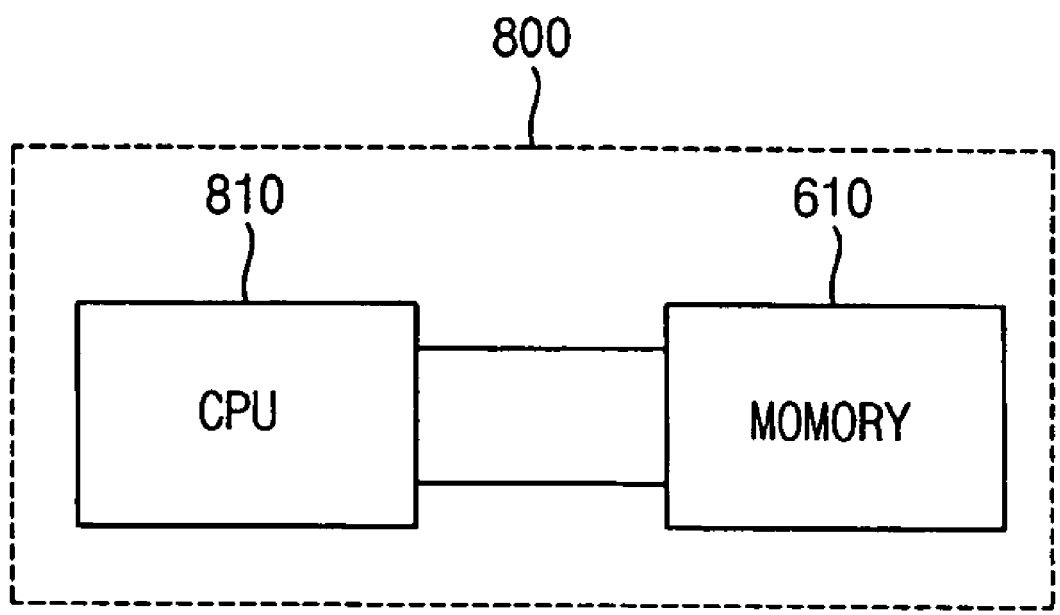
FIG. 28 illustrates a block diagram of a system including a semiconductor device in accordance with other example embodiments.

FIG. 28 illustrates a block diagram of another system including a semiconductor device in accordance with example embodiments.

Referring to FIG. 28, a computing system 800 may be provided according to example embodiments. The computing system 800 may include the memory 610 and a central processing unit (CPU) 810 connected to the memory 610. The memory 610 may be a DRAM device including a cylindrical capacitor having a support structure according to example embodiments. An example of the computing system 800 may be a laptop computer including flash memory as a main memory module. Additional examples of the computing system 800 may include digital devices in which the memory 610 for storing data and controlling functions may be built. The memory 610 may be directly connected to the CPU 810, or the memory 610 may be indirectly connected to the CPU 810 by buses. Although not illustrated in FIG. 28, other elements or devices may be included in the computing system 800.

According to example embodiments, cylindrical capacitors may not lean on each other or fall down while having high aspect ratio because of support structures therein, and thus a semiconductor device including the capacitors may not have 2-bit fail. Additionally, the support structures according to example embodiments may not be formed between adjacent capacitors, e.g., cylindrical capacitors, but formed inside the capacitors, so that the capacitors may be easily manufactured and the process margin may be enhanced.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A capacitor, comprising:
a cylindrical lower electrode structure on a substrate, the cylindrical lower electrode structure including a first lower electrode and a second lower electrode, the first lower electrode being between the substrate and the second lower electrode;
a support structure inside the cylindrical lower electrode structure;
a dielectric layer on the cylindrical lower electrode structure and the support structure; and
an upper electrode on the dielectric layer.

2. The capacitor as claimed in claim 1, wherein the support structure includes a filler layer and an etch stop layer, the filler layer being on a sidewall of the first lower electrode, and the etch stop layer being on a portion of a sidewall of the second electrode.

3. The capacitor as claimed in claim 2, wherein the dielectric layer extends along the first lower electrode, second lower electrode, and etch stop layer.

4. The capacitor as claimed in claim 1, wherein the support structure includes a filler layer and an etch stop layer, the filler layer completely filling the first lower electrode, and the etch stop layer being on the filler layer and inside the second lower electrode.

5. The capacitor as claimed in claim 1, wherein the support structure has a height of about 20% to about 50% of a height of the cylindrical lower electrode structure.

* * * * *